United States Patent [19]

Forster et al.

[11] Patent Number: 4,974,214

[45] Date of Patent: Nov. 27, 1990

[54] METHOD FOR THE SUPPRESSION OF INTERFERENCE SIGNALS DURING OPERATION OF ULTRASONIC PROXIMITY TRANSDUCERS

[75] Inventors: Alfred Forster, Schwandorf; Gerd Schorner, Amberg, both of Fed. Rep. of Germany

[73] Assignee: Siemens Aktiengesellschaft, Berlin and Munich, Fed. Rep. of Germany

[21] Appl. No.: 434,988

[22] Filed: Nov. 13, 1989

[30] Foreign Application Priority Data

Nov. 15, 1988 [EP] European Pat. Off. ........ 88119044.1

[51] Int. Cl.⁵ ...................... G01S 15/00; H03K 5/153
[52] U.S. Cl. ..................................... 367/98; 367/901; 307/358
[58] Field of Search ................... 367/13, 98, 901, 127; 307/358, 361

[56] References Cited

U.S. PATENT DOCUMENTS

| | | | |
|---|---|---|---|
| 4,176,337 | 11/1979 | Aechter et al. | 367/131 |
| 4,222,275 | 9/1980 | Sholl et al. | 73/636 |
| 4,315,325 | 2/1982 | Blades | 367/98 |
| 4,596,144 | 6/1986 | Panton et al. | 73/620 |
| 4,649,527 | 3/1987 | Forster et al. | 367/108 |
| 4,677,599 | 6/1987 | Obayashi et al. | 367/98 |
| 4,679,175 | 7/1987 | Eder et al. | 367/98 |
| 4,829,490 | 5/1989 | Parker | 367/98 |

FOREIGN PATENT DOCUMENTS

| | | |
|---|---|---|
| 0174090 | 3/1986 | European Pat. Off. . |
| 3428773 | 2/1986 | Fed. Rep. of Germany . |
| 2394811 | 6/1977 | France . |
| 2568687 | 2/1986 | France . |
| 2161932 | 1/1986 | United Kingdom . |

OTHER PUBLICATIONS

IEEE Transactions on Biomedical Engineering, vol. BME-27, No. 5, May 1980, pp. 249-253.

*Primary Examiner*—Ian J. Lobo
*Attorney, Agent, or Firm*—Kenyon & Kenyon

[57] ABSTRACT

A method for suppressing interference signals during operation of ultrasonic proximity transducers suppresses the interference signals that are generated by continuous noises. Repeated ultrasonic pulses are transmitted from an ultrasonic proximity transducer, and the received signals are scanned. The scanned values of the received signal are converted into digital values. After storage, the digital values are compared with a step function having one or more step sections of constant value serving as a time-dependent interference noise threshold so that the usable echo signal can be determined and separated from the interference signals. With further evaluation, the echo transit time of the usable echo signal is determined and provided to a control and evaluation unit. By suppressing continuous noises, and further suppressing stochastic interference signals, the usable echo signal is reliably filtered from a reception signal that is overlaid with interference signals.

7 Claims, 2 Drawing Sheets

METHOD FOR THE SUPPRESSION OF INTERFERENCE SIGNALS DURING OPERATION OF ULTRASONIC PROXIMITY TRANSDUCERS

FIELD OF THE INVENTION

The present invention relates to the field of interference signal suppression. More specifically, the invention relates to the suppression of interference signals during the operation of an ultrasonic proximity transducer using a control and evaluation unit.

BACKGROUND OF THE INVENTION

An ultrasonic proximity transducer repeatedly transmits ultrasonic pulses of equal width and subsequently outputs analog signals that are received, some of which contain an associated usable echo signal. The received analog signals are evaluated in a control and evaluation unit which takes into consideration deviations in the usable echo signals that are due to interference signals.

Interference suppression methods for ultrasonic proximity transducers are known, for example, from DE No. 34 28 773. In that reference, error pulses are eliminated using pulse width modulation wherein it is assumed that the transmitter always produces ultrasonic pulses of equal width. Error pulses are recognized since they are narrower or wider than the transmitted ultrasonic pulses. The only pulses considered for usable echo signals are those which exceed a constant error threshold. This serves to suppress interference described in the book *Halbleiter Schaltungtechnik* (*Semiconductor Circuitry*) by U. Tietze, Ch. Schenk on page 411.

SUMMARY OF THE INVENTION

The present invention provides an improved method for the suppression of interference signals occurring during operation of an ultrasonic proximity transducer and thereby avoids erroneous messages and/or switching actions. In an arrangement that has an ultrasonic proximity transducer, the received signal is used as a basis to determine a step function which serves as an interference noise threshold. The term "step function" is used here to describe a function which comprises one or more individual sections each of constant amplitude hereinafter referred to as "step sections". The step function is then compared with the reception signal to determine the temporal location of a usable echo signal. The transit time of the usable echo signal measured with respect to the beginning of the transmission is then subsequently determined and provided to a control and evaluation unit.

Using a step function as a time-dependent interference noise threshold has the advantage of suppressing interference noises that are considered over a period of time.

In an embodiment of the present invention, interference noise threshold values that differ from section to section are determined by forming the value of each step section of the step function from the sum of the mean value of the reception signal (associated in time with the particular step section) and a signal-to-noise ratio that is dependent on this mean value.

Since an interference noise threshold value is based on a portion of a received signal that is associated with a particular step section, the interference noise threshold values are suitable for differentiating between interference noises and the usable echo signal. For example, signals which have a relatively long duration will have a greater effect on the interference threshold value than those that have a relatively short duration such as the usable echo signal. An embodiment of the present invention takes advantage of this technique to form a mean value by initially scanning the received signal, digitizing the scanned values, and determining the mean values of the step sections of the step function from the digitized scanned values over time. This allows the digitized scanned values to be stored so that they will be available at any time for further evaluation.

In an embodiment of the present invention, the scanning is performed at equidistant time intervals to further facilitate a mean value formation of the received signal over a given time.

In an embodiment of the present invention, the digital values stored in memory that are used as a basis for forming the step function are updated with each received signal through a mathematical logical linkage with the latest scanned digital values. This decreases the falsifying effects of stochastic interference signals and complements the time-dependent threshold method that is used to reduce the effect of continuous noise.

An arrangement for suppressing interference signals constructed in accordance with an embodiment of the present invention includes an intermediate processing unit that is coupled between an output of an ultrasonic proximity transducer and an input of a control and evaluation unit. This intermediate processing unit comprises an analog to digital converter that has an integrated scanning device, a processor, a data memory, and a program memory. The analog to digital converter is coupled between the output of the ultrasonic proximity transducer and the input of the processor. The processor is coupled to the program memory, the data memory, and the control and evaluation unit.

DETAILED DESCRIPTION

Figure 1:
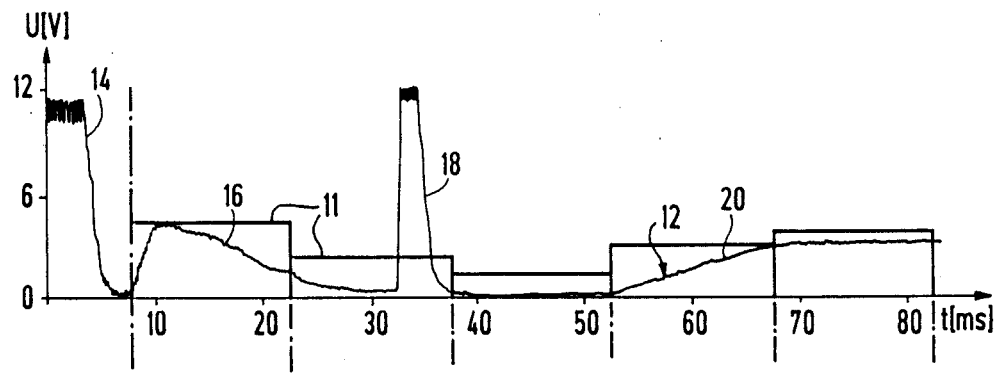
FIG. 1 shows the trace in time of a received signal 12 and a step function 11 used as an interference noise threshold.

The present invention provides ultrasonic distance measurement in which the received usable echoes of an ultrasonic transmission pulse are detected using a time-dependent threshold such as a step function having one or more step sections. This is necessary for the suppression of interference signals such as rain and noise. As an example, line 12 in FIG. 1 represents the voltage signal supplied by the ultrasonic proximity transducer in response to a received ultrasonic signal. At time t=0, the transmission pulse 14 begins, and after approximately 5 ms, this transmission pulse 14 begins to decay (at the end of the oscillation excitation) and falls to nearly 0. The fall of the transmission pulse 14 is followed in the sequence shown in FIG. 1 as an example, by an interference signal 16 caused by rain, a usable echo signal 18, and finally a noise signal 20. The interference signal 16 caused by rain and the noise signal 20 which lie below the step function 11 are suppressed and therefore allow the arrangement of the present invention to unambiguously detect the usable echo signal 18 as a short reception pulse.

For carrying out the detection of the usable echo signal 18, the received signal that follows the transmission pulse 14 is scanned, digitized, and stored. Scanning is performed in equal time intervals and facilitates the subsequent evaluation method. The stored digitized scanned values are compared with the step section values of step function 11 for the equivalent time period, and these step section values act as an interference noise threshold. The comparison identifies the usable echo signal 18 and therefore the amount of time from the beginning of the transmission pulse 14 to the reception of the usable echo signal 18. This time is subsequently evaluated according to known methods to determine distance.

In order to detect a usable echo signal 18 with a level that is lower than some interference noises, the present invention uses a step function 11 that can have different thresholds for each step section, the threshold being constant in each step section. The threshold for each step section is formed by adding the mean value of the stored digitized scanned values, calculated over a time interval associated with each step section, to a signal-to-noise ratio. This addition results in an interference noise threshold value that is valid for a particular time interval. The signal-to-noise ratio can be different for each step section and can depend, for example, on the mean value of the stored digitized scanned values associated with the particular time interval. Since interference signals change slowly over time, in an embodiment of the invention, low signal-to-noise ratios can be added to high mean values while comparatively higher signal-to-noise ratios can be added to low mean values. An embodiment for determining the signal-to-noise ratio will be described later.

The measures of the present invention described above suppress continuous interference noises in the reception signal. In order to also suppress stochastic interferences in the reception signal, the following method is used according to the present invention which is explained using the block circuit illustrated in FIG. 2.

Figure 2:
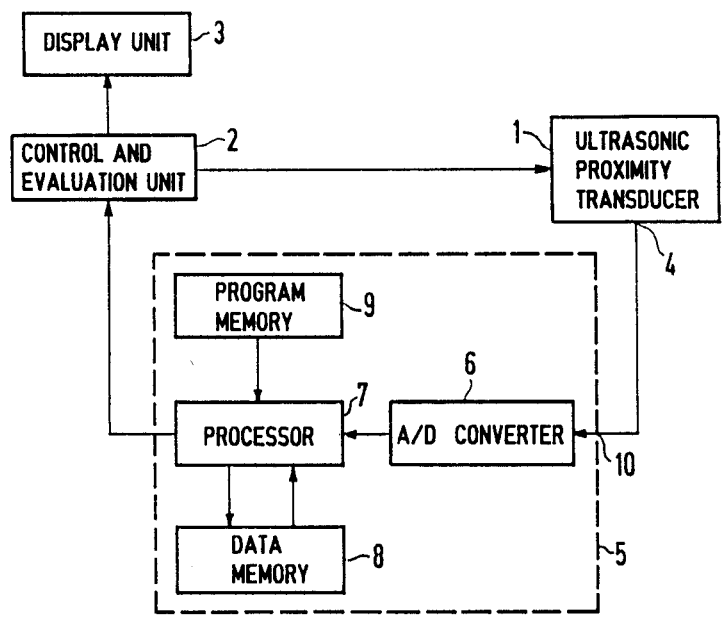
FIG. 2 is a block circuit diagram of an arrangement for ultrasonic distance measurement constructed in accordance with an embodiment of the present invention.

The arrangement of FIG. 2 for ultrasonic distance measurement comprises an ultrasonic proximity transducer 1, a control and evaluation unit 2, a display unit 3, and an intermediate processing unit 5, which is coupled between the ultrasonic proximity transducer 1 and the control and evaluation unit 2. The intermediate processing unit 5 comprises an analog to digital converter 6 that has an integrated scanning device, a processor 7, e.g., a microprocessor, a data memory 8, e.g., RAM, and a program memory 9, e.g., ROM. The analog to digital (A/D) converter 6 is coupled to the input 10 of the intermediate processing unit 5 and is coupled at its output to the input of the processor 7. The output of processor 7 is coupled to the input of the control and evaluation unit 2. The data memory 8 and the program memory 9 are coupled to the processor 7.

Under the control of the control and evaluation unit 2, the ultrasonic proximity transducer 1 sends cyclic ultrasonic pulses of equal width and receives associated echo signals. The analog signal appearing at the output 4 of the ultrasonic proximity transducer 1 is scanned by the A/D converter 6 beginning at the moment the transmission of the ultrasonic pulses is complete. The scanning takes place up to the point in time corresponding to the distance limit of the detection range and is done in equal time intervals. The scanned analog values are digitized in the A/D converter 6 and then provided to the processor 7. These digitized scanned values are mathematically logically linked by the processor 7 with other digital values corresponding to the same time intervals, these digital values being stored in the data memory 8. The time intervals of the scannings are dependent on the type of mathematical logical linkage chosen and on the structural elements for carrying out the linkage. For simple linkages, time intervals below 30 to 50 $\mu s$, for example, can be achieved. A program is stored in the program memory 9 which controls the linking performed in the processor 7.

In the simplest case, the appropriate digital values are mathematically logically linked with each other through a mean value formation in which the digital values earlier stored in the data memory 8 are weighted differently than the latest digitized scanned values. For example, assume that the latest digitized scanned value is 1 and the corresponding stored digital value is 3. If the weighting factor for each stored digital value is 4 and for each latest digitized scanned value is 1, then a new value of 2.6 results through mean value formation. $[((1 \times 1)+(3 \times 4))/(1+4)=2.6]$. The re-calculated digital values are stored in the data memory 8 replacing the previous stored digital values for corresponding points in time. In addition, the new digital values are provided by the processor 7 to the control and evaluation unit 2. Here, the digital values are evaluated and the object distance is determined in a customary manner from the time interval between the sending of the ultrasonic pulses and the reception of the associated usable echo signal 18. In order to recognize the usable echo signal 18, a known pulse width evaluation scheme can be used.

Furthermore, in an embodiment of the method according to the present invention, the amplitude of the stored digital values is also evaluated. In this case, a limit value is provided which has a maximum magnitude that remains below the amplitude of the usable echo signal 18. Only the pulses above the limit value are evaluated and the pulses below the limit value, such as stochastic interference signals, are suppressed. In this manner, the usable echo signal 18 and, therefore, the object distance can be determined with maximum certainty.

The block circuit illustration in FIG. 2 is also applicable to the method for the suppression of primarily continuous noises and can be based on a time-dependent threshold in which each reception signal is evaluated independently. The digital values present at the output of the A/D converter 6 are transferred via the processor 7 (which remains coupled with the program memory 9) to the data memory 8 for storage. Using a program stored in the program memory 9, testing takes place in the processor 7 to determine which of the digitalized scanned values of the received signal stored in the data memory 8 exceed the values for corresponding times of a time-dependent interference noise threshold. The time-dependent interference noise threshold can be, for example, the step function 11 shown in FIG. 1. In this case, the processor calculates the time-dependent interference noise threshold in the form of a step function 11 from the digitized scanned values according to a program in the program memory 9. This is done, for example, by forming a mean value from the digitized scanned values of each time interval and adding to it a signal-to-noise ratio. The signal-to-noise ratio can be a variable that is dependent on the mean value and thus determined in the processor 7, or it can also be given, for example, as a constant in data memory 8.

By combining the method for suppressing stochastic interference signals with the method for excluding primarily continuous interference noises present in the received signal, a usable echo signal 18 is reliably determined. In contrast to the method described above for the suppression of continuous noises, the digitized scanned values of the latest received echo signal are not directly evaluated in this embodiment. Instead, as described earlier with respect to the method for suppressing stochastic interference signals, the latest digitized scanned signals are initially mathematically logically linked with other stored digital values that have been determined from the linkage of preceding echo signals. The latest digitized scanned values are linked with these stored digital values before they are compared with a time-dependent interference noise threshold, now using the earlier-described embodiment for suppressing continuous noises. From this, the transit time of the usable echo signal 18 is measured and the associated distance of the measured object determined from known techniques.

Figure 3:
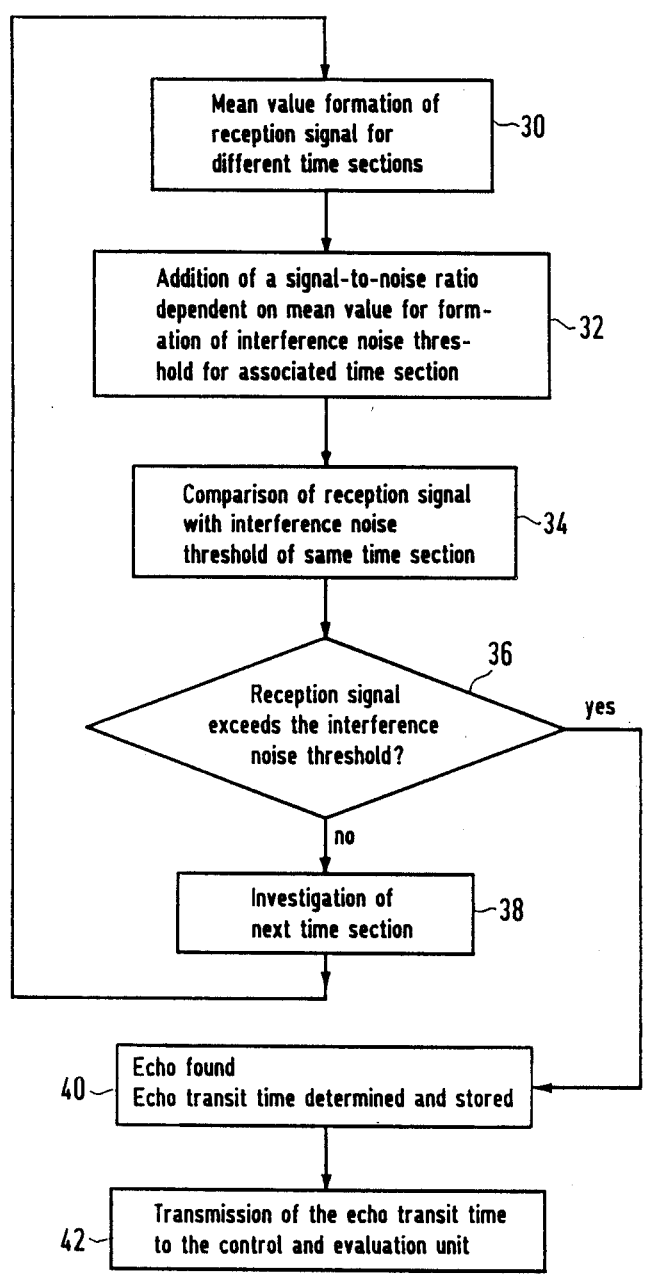
FIG. 3 is a flow diagram of an embodiment of the method of interference signal suppression of the present invention.

An embodiment of a flow diagram of the method of interference signal suppression is shown in FIG. 3. In step 30, a mean value for each of the different time sections of the reception signal is formed. In step 32, a signal-to-noise ratio is added to the mean value to form an interference noise threshold for each time interval. The value of the signal-to-noise ratio depends on the mean value. The interference noise threshold from step 32 is then compared with the reception signal corresponding to the same time interval in step 34. If it is determined in step 36 that the reception signal exceeds the interference noise threshold, then it is determined in step 40 that an echo is found and the echo transit time is calculated and stored. The echo transit time is then transmitted to the control and evaluation unit as is shown in step 42. If it is determined in step 36 that the reception signal does not exceed the interference noise threshold, then an investigation of the next time (or step) section is initiated in step 38.

What is claimed is:

1. A method for suppressing interference signals during operation of an ultrasonic proximity transducer which is coupled to a control and evaluation unit, comprising:
   repeatedly transmitting ultrasonic pulses of equal width from the ultrasonic proximity transducer,
   outputting reception signals produced with the ultrasonic proximity transducer, said signals containing associated usable echo signals and interference signals;
   using said reception signals as a basis to form a step function having one or more step sections that is used as an interference noise threshold;
   comparing said step function with each of said reception signals to determine the occurrence of one of said usable echo signals in time and to suppress interference signals;
   determining a transit time of said usable echo signal from the beginning of the transmission of an ultrasonic pulse; and
   providing said transit time to the control and evaluation unit.

2. The method of claim 1, wherein the step of using said reception signals as a basis to form a step function includes forming a constant value for each particular step section in said step function by summing a mean amplitude value of said reception signal over a time interval associated with each particular step section and a signal-to-noise ratio value that is dependent on said mean value of said reception signal in a particular time interval.

3. The method of claim 2, further comprising:
   initially scanning said reception signal to obtain scanned values;
   periodically sampling and digitizing the resulting scanned values; and
   determining said mean values of said step sections in said step function using digital values obtained from said digitized scanned values that correspond in time with each particular step section.

4. The method of claim 3, wherein said step of periodically sampling and digitizing said scanned values is performed at equal time intervals.

5. The method of claim 4, further comprising:
   storing said digital values in a memory;
   newly calculating said digital values with each reception signal based on a mathematical correspondence of said digitized scanned values with stored digital values from preceding reception signals that correspond with each other with respect to time; and
   using said digital values that are stored in a memory as bases for said step of determining said mean values.

6. The method of claim 5, wherein said mathematically logically linking includes forming a mean value based on a weighted average of said digitized scanned values and said stored digital values that correspond with each other with respect to time.

7. An arrangement for suppressing interference signals during operation of an ultrasonic proximity indicator, including an ultrasonic proximity transducer and a control and evaluation unit comprising:
   an intermediate processing unit adapted to be coupled between the output of said transducer and the input of said control and evaluation unit, said intermediate processing unit including:
      an analog to digital converter having an integral scanning device, said analog to digital converter adapted to be coupled to the output of the ultrasonic proximity transducer;
      a processor coupled to the analog to digital converter and having an output adapted to be coupled to the control and evaluation unit;
      a data memory coupled to the processor; and
      a program memory coupled to the processor,
   wherein said program memory programs said processor to:
      (a) store digital values in said data memory;
      (b) newly calculate said digital values with each reception signal based on a mathematical correspondence of scanned digitized values with stored digital values from preceding reception signals;
      (c) use the newly calculated digital values to determine mean values over a period of time;
      (d) add to said mean values a signal-to-noise ratio dependent upon said mean value to form a step function;
      (e) compare said step function with said digital values to determine a usable echo;
      (f) determine the transit time of said usable echo; and
      (g) provide said transit time as an output to said control and evaluation unit.

* * * * *